United States Patent [19]
Rodder et al.

[11] Patent Number: 5,976,937
[45] Date of Patent: Nov. 2, 1999

[54] TRANSISTOR HAVING ULTRASHALLOW SOURCE AND DRAIN JUNCTIONS WITH REDUCED GATE OVERLAP AND METHOD

[75] Inventors: Mark S. Rodder, University Park; Mahalingam Nandakumar, Richardson, both of Tex.

[73] Assignee: Texas Instruments Incorporated, Dallas, Tex.

[21] Appl. No.: 09/136,750

[22] Filed: Aug. 19, 1998

Related U.S. Application Data

[60] Provisional application No. 60/057,145, Aug. 28, 1997.

[51] Int. Cl.$^6$ ............................................. H01L 21/8234
[52] U.S. Cl. ..................... 438/275; 438/229; 438/232; 438/277; 438/302; 438/306; 438/209; 438/525
[58] Field of Search ..................... 438/525, 299, 438/301, 302, 306, 307, 199, 209, 275, 229, 232, 277, 297, FOR 169, FOR 216, FOR 217, FOR 218; 148/DIG. 111

[56] References Cited

PUBLICATIONS

1992 IEEE, IEDM 92–699, "High Carrier Velocity and Reliability of Quarter–Micron SPI (Self–Aligned Pocket Implantation) MOSFETs," pp. 28.3.1–28.3.4 (Atsushi Hori, Akira Hiroki, Mizuki Segawa, Takashi Hori, Akihira Shinohara, Mitsuo Yasuhira and Shigenobu Akiyama).

1993 IEEE, IEDM 93–119, "Sub–50 NM Gate Length N–MOSFETs With 10 NM Phosphorus Souce and Drain Junctions," pp. 6.2.1–6.2.4 (Mizuki Ono, Masanobu Saito, Takashi Yoshitomi, Claudio Fiegna, Tatsuya Ohguro and Hiroshi Iwai).

*Primary Examiner*—Teresa M. Arroyo
*Assistant Examiner*—Long Pham
*Attorney, Agent, or Firm*—Jacqueline J. Garner; Wade James Brady; Richard L. Donaldson

[57] ABSTRACT

Method of making transistors having ultrashallow source and drain junction with reduced gate overlap may comprise forming a first gate electrode (124) separated from a first active area (126) of a semiconductor layer (112) by a first gate insulator (130). A second gate electrode (140) may be formed substantially perpendicular to the first gate electrode (124) and separated from a second active area (142) of the semiconductor layer by a second gate insulator (146). A masking layer (160) may be formed over the semiconductor layer (112) and expose a source and a drain section (162 and 164) of the first active area (126) and a source and a drain section (166 and 168) of the second active area (142). Dopants may be implanted from a first direction substantially parallel to the first gate electrode (124) into the source and drain sections (166 and 168) of the first active area (126). The dopants are implanted in the first direction at an angle at which the masking layer (160) blocks entry of the dopants into the source and drain sections (166 and 168) of the second active area (142). Dopants may be implanted from a second direction substantially parallel to the second gate electrode (140) and perpendicular to the first direction into the source and drain sections (166 and 168) of the second active area (142). The dopants are implanted in the second direction at an angle at which the masking layer (160) blocks entry of the dopants into the source and drain sections (162 and 164) of the first active area (126).

21 Claims, 4 Drawing Sheets

TRANSISTOR HAVING ULTRASHALLOW SOURCE AND DRAIN JUNCTIONS WITH REDUCED GATE OVERLAP AND METHOD

This application claims priority under 35 USC §119 (e) (1) of provisional application Ser. No. 60/057,145, filed Aug. 28, 1997.

RELATED APPLICATIONS

This application is related to copending U.S. application Ser. No. 09/136,333, entitled "Transistors with Independently Formed Gate Structures and Method" and copending U.S. application Ser. No. 09/136,749, entitled "Transistor Having Localized Source and Drain Extensions and Method".

TECHNICAL FIELD OF THE INVENTION

This invention relates generally to the field of semiconductor devices, and more particularly to a transistor having ultrashallow source and drain junctions and/or pockets with reduced gate overlap and to a method of making the same.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, they are based on the movement of charge carriers.

Solid state devices include transistors, capacitors, resistors and the like. Transistors typically include source and drain regions separated by a channel region. A gate controls the flow of current from the source region to the drain region through the channel region.

Increasingly, transistors and other solid state devices are made smaller to reduce the size of electronic equipment. For transistors, the smaller size compels a narrow gate which can lead to short-channel effects between the source and drain regions. Implant channeling of dopants from the source and drain regions to under the gate further shortens the channel and degrades the performance of the transistor.

SUMMARY OF THE INVENTION

Accordingly, a need has arisen in the art for an improved transistor. The present invention provides transistors having ultrashallow source and drain junctions with reduced gate overlap and localized pocket implants that substantially eliminate or reduce the disadvantages and problems associated with prior systems and methods.

In accordance with the present invention, the transistors may be made by forming a first gate electrode separated from a first active area of a semiconductor layer by a first gate insulator. A second gate electrode may be formed substantially perpendicular to the first gate electrode and separated from a second active area of the semiconductor layer by a second gate insulator. A masking layer may be formed over the semiconductor layer and expose a source and a drain section of the first active area and a source and a drain section of the second active area. Dopants may be implanted from a first direction substantially parallel to the first gate electrode into the source and drain sections of the first active area. The dopants are implanted in the first direction at an angle to the wafer such that the masking layer blocks entry of the dopants into the source and drain sections of the second active area. Dopants may be implanted from a second direction substantially parallel to the second gate electrode and perpendicular to the first direction into the source and drain sections of the second active area. The dopants are implanted in the second direction at an angle to the wafer such that the masking layer blocks entry of the dopants into the source and drain sections of the first active area.

More specifically, in accordance with one embodiment of the present invention, the doped source sections of the active areas may be localized source extensions. The doped drain sections of the active areas may be localized drain extensions. In this embodiment, pocket dopants may be implanted from the first direction to form localized pockets bounding the inner perimeters of the localized extension. Pocket dopants may be implanted from the second direction to form localized pockets bounding the inner perimeter of the localized extensions.

Technical advantages of the present invention include providing an improved transistor having ultrashallow source and drain junctions with reduced gate overlap. In particular, source and drain dopants may be implanted at an angle to produce the ultrashallow junctions. The angled dopants may be implanted from a direction substantially parallel to the gate electrode to minimize gate overlap. Accordingly, the transistor has a lower capacitance and may be more quickly charged for faster circuit speeds.

Another technical advantage of the present invention includes providing an improved method of forming the source and drain regions. In particular, a photoresist masking layer may be formed over the semiconductor layer that allows angled dopant implantation in directions parallel to a gate electrode. The masking layer blocks dopant implantation from directions perpendicular to the gate electrode. After implantation is completed, the masking layer may then be removed by conventional methodology. Accordingly, the ultrashallow source and drain junctions with reduced gate overlap may be formed using conventional integrated circuit processing techniques and equipment.

Other technical advantages will be readily apparent to one skilled in the art from the following figures, description and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1–3 of the drawings, in which like numerals refer to like parts throughout the several views. FIGS. 1–3 illustrate fabrication of transistors having localized source and drain extensions and localized pockets and/or ultrashallow source and drain junctions and ultrashallow pockets with reduced gate overlap. As described in more detail below, the localized source and drain extensions may reduce implant damage to the source and drain regions. The localized pockets may reduce capacitance of the source and drain regions. The ultrashallow junctions with minimal gate overlap may also reduce overlap capacitance to the gate electrode. Accordingly, the transistor may be more quickly charged and circuit speed correspondingly increased.

FIGS. 1A–E are a series of schematic cross-sectional diagrams illustrating fabrication of a transistor with localized source and drain extensions and pockets in accordance with one embodiment of the present invention. In this embodiment, the transistor may be a metal oxide semiconductor field effect transistor (MOSFET) of a sub-micron regime. It will be understood that the type and size of the transistor may be varied within the scope of the present invention.

Figure 1A:
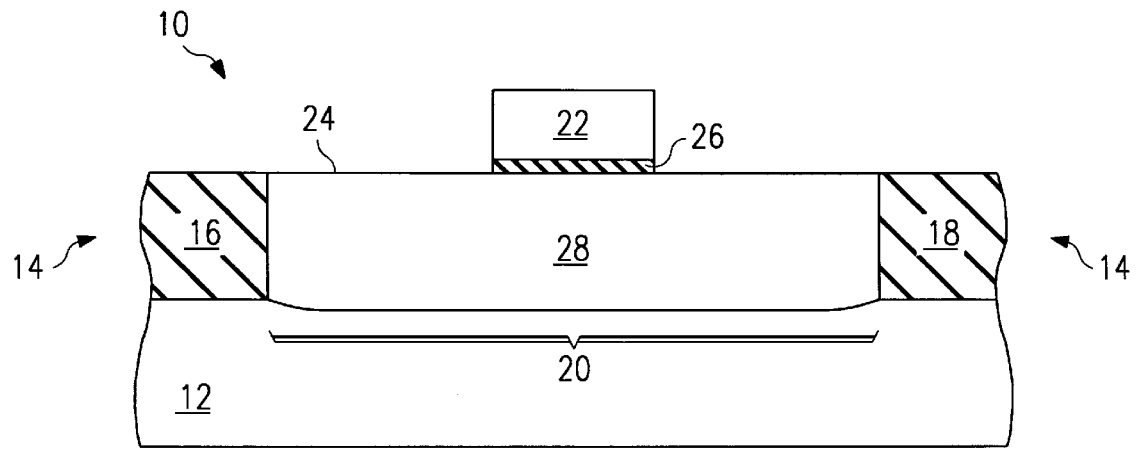
FIGS. 1A–E are a series of schematic cross-sectional diagrams illustrating fabrication of a transistor with localized source and drain extensions and pockets in accordance with one embodiment of the present invention.

Referring to FIG. 1A, an initial semiconductor structure 10 may comprise a semiconductor layer 12. The semiconductor layer 12 may be a substrate such as a wafer. In this embodiment, the semiconductor layer 12 may comprise a single-crystalline silicon material. It will be understood that the semiconductor layer 12 may also be a layer of semiconductor material formed on a substrate. For example, the semiconductor layer 12 may be an epitaxial layer grown on a wafer.

A first isolation member 16 and a second isolation member 18 may be formed in the semiconductor layer 12. The isolation members 16 and 18 may be independent structures or part of a unitary structure. For sub-micron applications, the isolation members 16 and 18 may comprise shallow isolation trenches. It will be understood that other types of isolation members and/or structures may be used within the scope of the present invention. For example, the isolation members 16 and 18 may comprise a field oxide.

The isolation members 16 and 18 may define an active area 20 in the semiconductor layer 12. As described in more detail below, source, drain and channel regions may be defined in the active area 20. A gate electrode may control the flow of current from the source region to the drain region through the channel region to operate the transistor. It will be understood that the active area 20 may comprise other regions within the scope of the present invention.

A gate electrode 22 may be disposed over and insulated from the active area 20. In one embodiment, the gate electrode 22 may be separated from an outer surface 24 of the active area 20 by a gate insulator 26. In this embodiment, the gate electrode 22 may comprise polycrystalline silicon or other suitable semiconductor material. The gate insulator 26 may comprise silicon dioxide or other suitable insulating material. It will be understood that the gate electrode 22 may be otherwise associated with the active area 20 within the scope of the present invention.

In a particular embodiment, the transistor may comprise an n-MOS transistor. In this embodiment, the active area 20 may comprise a p-well 28 formed in the semiconductor layer 12. The p-well 28 may comprise the single-crystalline silicon material of the semiconductor layer 12 slightly doped with the p-type dopant such as boron. It will be understood that the semiconductor layer 12 may comprise other materials or be otherwise doped within the scope of the present invention. For example, the semiconductor layer 12 may itself be slightly doped eliminating the need for the well 28.

Figure 1B:
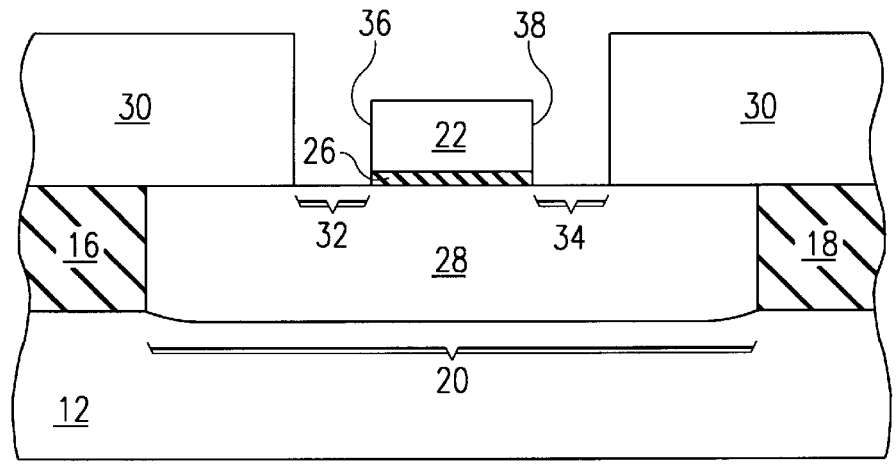

Referring to FIG. 1B, a masking layer 30 may be formed over the semiconductor layer 12 and expose a first section 32 and a second section 34 of the active area 20. In one embodiment, the exposed first section 32 may be proximate to a first side 36 of the gate electrode 22 facing the first isolation member 16. The exposed second section 34 may be proximate to a second side 38 of the gate electrode 22 facing the second isolation member 18. It will be understood that the sections 32 and 34 exposed by the masking layer 30 may vary within the scope of the present invention.

The thickness of the masking layer 30 may vary within the scope of the present invention. As described in more detail below, the masking layer 30 may have a predefined thickness based on the size of the exposed sections 32 and 34 and on an implant angle of dopants into the exposed sections 32 and 34. It will be understood that the thickness of the masking layer 30 may be independently set or depend on other parameters within the scope of the present invention.

In one embodiment, the masking layer 30 may comprise photoresist material. In this embodiment, the masking layer 30 may be conventionally coated, patterned and etched to expose the first and second sections 32 and 34 of the active area 20. It will be understood that the masking layer 30 may comprise other materials and/or be otherwise formed within the scope of the present invention.

Figure 1C:
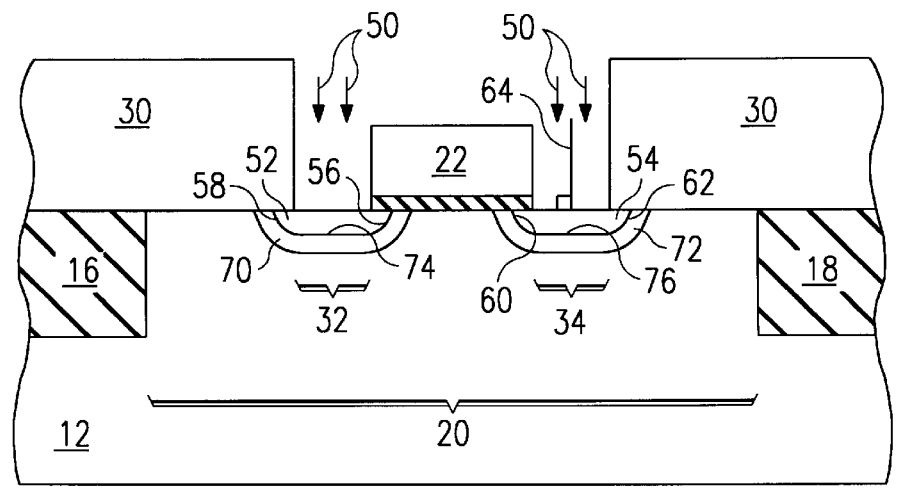

Referring to FIG. 1C, dopants 50 may be implanted into the exposed first section 32 to form at least part of a source region and into the exposed second section 34 to form at least part of a drain region. The dopants may be implanted in accordance with conventional integrated circuit processing techniques. In one embodiment, the doped exposed first section 32 may comprise a source extension 52. The doped exposed second section 34 may comprise a drain extension 54. It will be understood that the exposed first and second sections 32 and 34 of the active area 20 may comprise other elements of the source and drain regions within the scope of the present invention.

In accordance with the present invention, the source extension 52 is localized in that it is spaced apart from the first isolation member 16 and thus does not extend the distance between the gate electrode 22 and the first isolation member 16. Similarly, the drain extension 54 is localized in that it is spaced apart from the second isolation member 18 and thus does not extend the full distance between the gate electrode 22 and the second isolation member 18. Accordingly, the localized source and drain extensions 52 and 54 reduce implant damage to the source and drain regions. Accordingly, the main body and contacts of the source and drain regions may be formed with minimal interference from the extensions.

In one embodiment, the localized source extension 52 may have a first channel end 56 disposed slightly under the gate electrode 22 and an opposite second end 58 disposed toward but spaced apart from the first isolation member 16. Similarly, the localized drain extension 54 may have a first channel end 60 disposed slightly under the gate electrode 22 and an opposite second end 62 disposed toward but spaced apart from the second isolation member 18. In this embodiment, the localized source extension 52 may extend less than half the distance between the gate electrode 22 and the first isolation member 16 while the localized drain extension 54 extends less than half the distance between the gate electrode 22 and the second isolation member 18. In a particular embodiment, the localized source and drain extensions 52 and 54 may each be less than 0.3–0.4 microns in length beyond the edge of the gate electrode 22. It will be understood that the localized source and drain extensions 52 and 54 may be of other absolute or relative lengths within the scope of the present invention.

The localized source and drain extensions 52 and 54 may each vertically overlap the gate electrode 22 by approximately 100–200 angstroms. This overlap may be induced by thermal treatment or other migration of the implanted dopants. It will be understood that the localized source and drain extensions 52 and 54 may be otherwise disposed with respect to the gate electrode 22.

As previously described, the masking layer 30 may have a predefined thickness based on an implant angle of the dopants 50 and on the size of the exposed sections 32 and 34 of the active area 20. In one embodiment, the dopants 50 may be implanted at an angle of substantially zero degrees from a perpendicular 64 to the semiconductor layer 12. The exposed sections 32 and 34 may be sized between 0.1–0.3 microns. In this embodiment, the masking layer 30 may have a thickness of 0.3–1.3 microns. It will be understood that the masking layer 30 may comprise other thicknesses, the dopants 50 may be implanted at other angles and that the exposed sections 32 and 34 may be otherwise sized within the scope of the present invention. For example, as described below in connection with FIGS. 2–3, the dopants 50 may be implanted at an angle to produce ultrashallow extensions 52 and 54. In this embodiment, the dopants 50 may be implanted from a direction substantially parallel to the gate electrode 22. The masking layer 30 may block entry of dopants implanted from non-parallel directions to the gate electrode 22 into the exposed sections 32 and 34 of the active area 20.

Pocket dopants may be implanted into the exposed sections 32 and 34 inwardly of the extensions 52 and 52 to form a source pocket 70 and a drain pocket 72. The pockets 70 and 72 may be used in connection with the extensions 52 and 54 to reduce gate length sensitivity of drive current. In one embodiment, the pocket dopants may be the dopants of the opposite type used to form the extensions 52 and 54, but be implanted in the semiconductor layer 12 at a higher energy. It will be understood that the pockets 70 and 72 may comprise dopants otherwise introduced within the scope of the present invention. For example, the pocket dopants may be implanted at the same or other energy.

The source pocket 70 may be localized and bound an inner perimeter 74 of the localized source extension 52. The drain pocket 72 may be similarly localized and bound an inner perimeter 76 of the localized drain extension 54. It will be understood that the source and drain pockets 70 and 72 may be otherwise configured within the scope of the present invention. It will be understood that the pockets 70 and 72 may be localized independently of the extensions 52 and 54.

For the n-MOS transistor embodiment, the localized source and drain extensions 52 and 54 may each comprise n-type dopants such as arsenic. In this embodiment, the localized source and drain pockets 70 and 72 may comprise p-type dopants such as boron or indium. It will be understood that the localized source and drain extensions 52 and 54 and pockets 70 and 72 may be otherwise doped within the scope of the present invention.

In one embodiment, the dopants 50 may be implanted to a moderately doped concentration. In this embodiment, the dopants 50 may be implanted to a concentration of about 1–2 E19/CM$^3$. In another embodiment, the dopants 50 may be implanted to a heavily doped concentration. In this embodiment, the dopants 50 may be implanted to a concentration of about 1–2 E20/CM$^3$. It will be understood that dopants 50 may be implanted to other concentrations within the scope of the present invention.

After the localized source and drain extensions 52 and 54 and pockets 70 and 72 have been formed, the masking layer 30 may be removed. For the photoresist embodiment of the masking layer 30, the masking layer 30 may be removed by conventional processing. It will be understood that the masking layer 30 may be otherwise removed within the scope of the present invention.

Figure 1D:
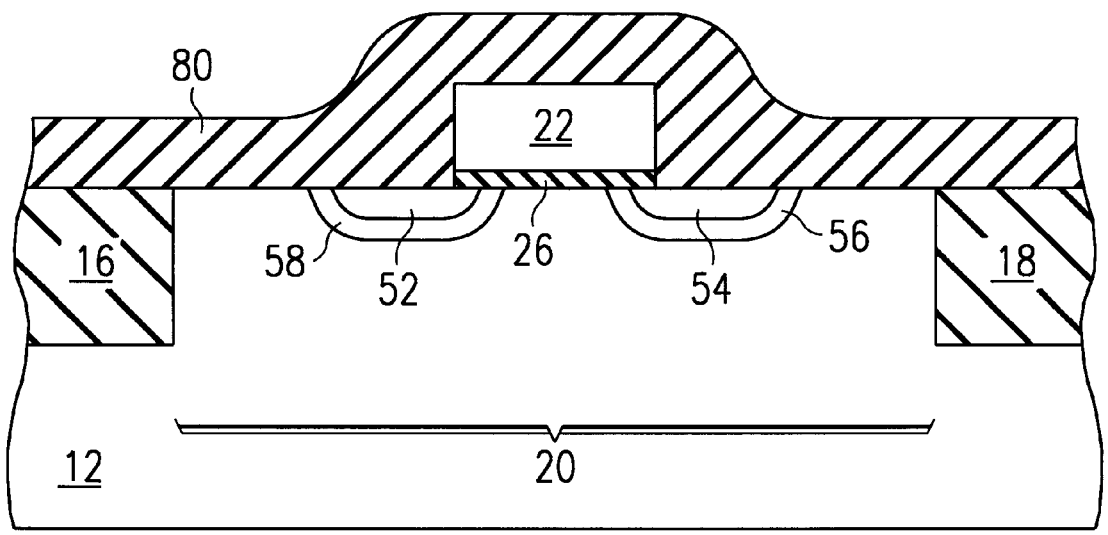

Referring to FIG. 1D, an insulating layer 80 may be deposited outwardly of the semiconductor layer 12 and the gate electrode 22. In one embodiment, the insulating layer 80 may be deposited directly onto the semiconductor layer 12 and the gate electrode 22. In this embodiment, the insulating layer 80 may comprise an oxide and/or nitride layer. It will be understood that the insulating layer 80 may comprise other materials capable of insulating semiconductor elements.

Figure 1E:
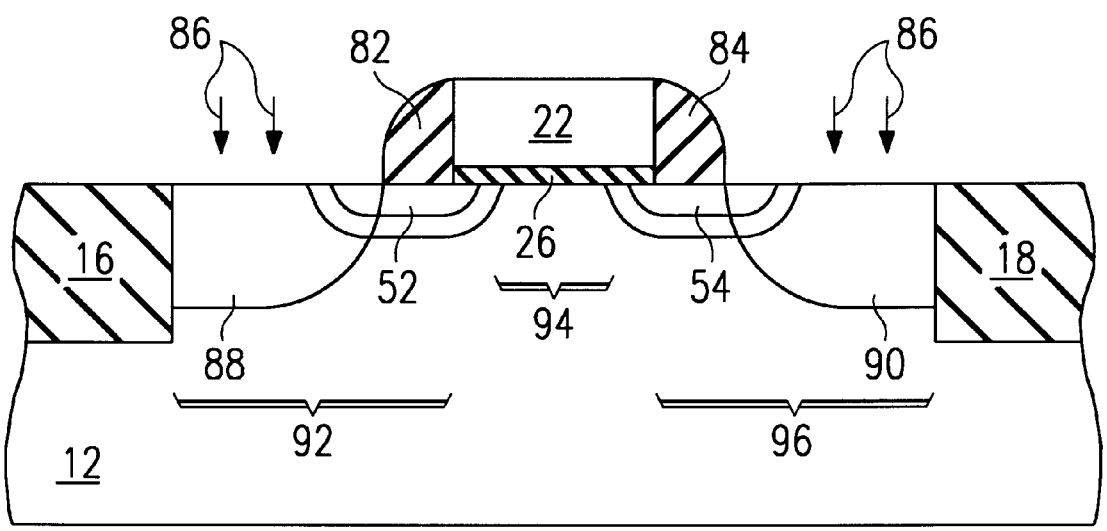

Referring to FIG. 1E, the insulating layer 80 may be anisotropically etched to form a first sidewall 82 adjacent the first side 36 of the gate electrode 22 and a second sidewall 84 adjacent the second side 38 of the gate electrode 22. The anisotropic etch may be a conventional reactive ion etch (RIE) using processes well known in the art. The sidewalls 82 and 84 may electrically isolate sides 36 and 38 of the gate electrode 22 from other elements of the transistor.

Dopants 86 may be implanted into the exposed portions of the active area 20 between the first sidewall 82 and isolation member 16 to form a source main body 88 and between the second sidewall 84 and isolation member 18 to form a drain main body 90. Accordingly, the dopant implant process to form the source and drain main bodies 88 and 90 is self-aligned between the respective sidewalls 82 and 84 and isolation structures 16 and 18. It will be understood that the source and drain main bodies 88 and 90 may be otherwise formed within the scope of the present invention.

The source region may comprise the source main body 88, the localized source extension 52 and the localized source pocket 70. In this embodiment, the source main body 88 may abut the first isolation member 16 and extend to overlap the localized source extension 52. The source main body 88 may be laterally spaced apart from the gate electrode 22. The localized source 52 may extend from the source main body 88 to a channel region 94 defined in the semiconductor layer 12 inwardly of the gate electrode 22. It will be understood that the source region and/or main body 88 may be otherwise configured within the scope of the present invention.

The drain region may similarly comprise the drain main body 90, the localized drain extension 54 and the localized drain pocket 72. In this embodiment, the drain main body 90 may abut the second isolation member 18 and extend to overlap the localized drain extension 54. The drain main body 90 may be laterally spaced apart from the gate electrode 22. The localized drain extension 54 may extend from the drain main body 90 to the channel region 94. It will be understood that the drain region and/or main body 90 may be otherwise configured within the scope of the present invention.

FIGS. 2–3 illustrate fabrication of transistors having ultrashallow junctions with reduced gate overlap in accordance with one embodiment of another aspect of the present invention. In this embodiment, the transistors may be metal oxide semiconductor field effect transistors (MOSFET) of a sub-micron regime. It will be understood that the type and size of the transistors may vary within the scope of the present invention.

Figure 2A:
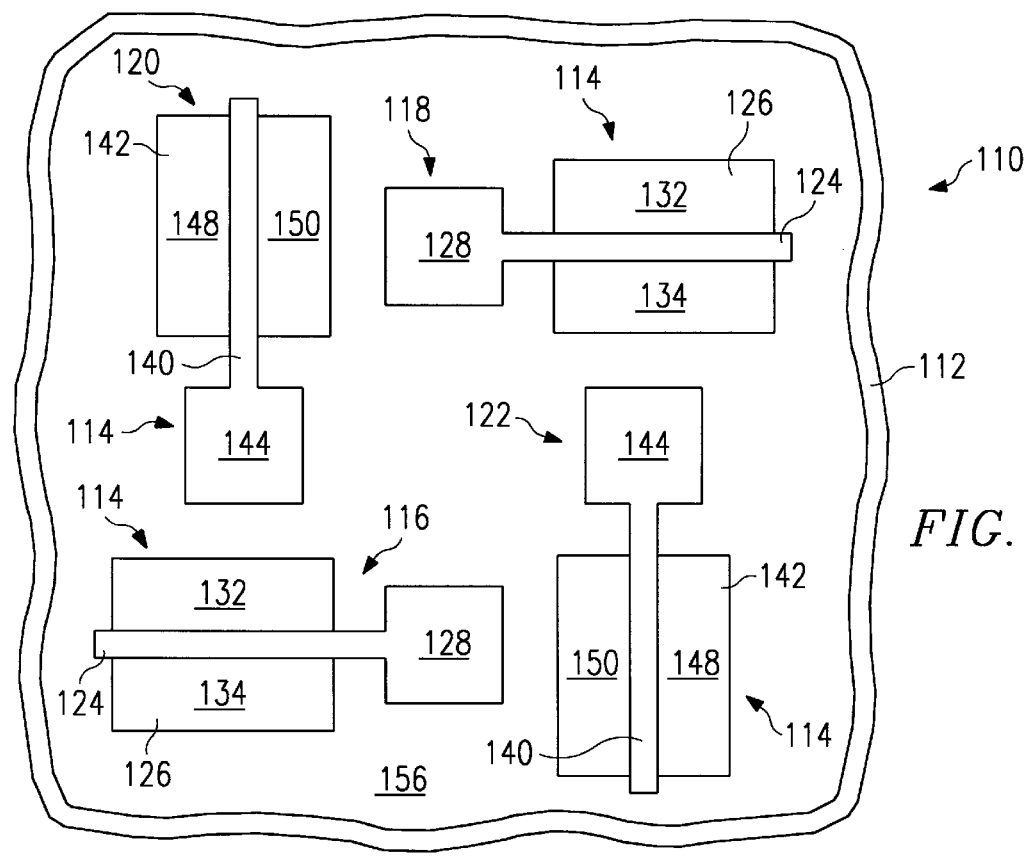
FIGS. 2A–B are a series of schematic top plan diagrams illustrating a plurality of transistors with active areas formed in a semiconductor layer and a mask exposing limited sections of each active area in accordance with one embodiment of the present invention.

Referring to FIG. 2A, an initial semiconductor structure 110 may comprise a semiconductor layer 112. As previously described in connection with the semiconductor layer 12, the semiconductor layer 112 may be a substrate such as a wafer. In this embodiment, the semiconductor layer 112 may comprise a single-crystalline silicon material. It will be understood that the semiconductor layer 112 may also be a layer of semiconductor material formed on a substrate. For example, the semiconductor layer 112 may be an epitaxial layer grown on a wafer.

Transistors 114 may be formed on the semiconductor layer 112. In one embodiment, the transistors 114 may be arranged in different directions to increase circuit density. In this embodiment, the transistors 114 may be arranged with adjacent transistors perpendicular to one another and once removed transistors that are adjacent to adjacent transistors parallel to one another. Thus, transistor 116 may be parallel to once removed transistor 118 and perpendicular to adjacent transistors 120 and 122. It will be understood that the transistors 114 may be otherwise arranged within the scope of the present invention.

In the MOSFET transistor embodiment, parallel transistors 116 and 118 may each comprise a gate electrode 124 disposed over and insulated from an active area 126. The gate electrode 124 may include an enlarged contact area 128 and be insulated from the outer surface of the active area 126 by a gate insulator 130 (FIGS. 3). The gate electrode 124 may comprise polycrystalline silicon or other suitable semiconductor material. The gate insulator 130 may comprise silicon dioxide or other suitable insulating material.

The active areas 126 may each comprise a source region 132 separated from a drain region 134 by a channel region 136 (FIGS. 3). The gate electrode 124 may control the flow of current from the source region 132 to the drain region 134 through the channel region 136 to operate the transistor 116 or 118. It will be understood that the active area 126 may comprise other regions within the scope of the present invention.

Transistors 116 and 118 may be parallel to each other in that their gate electrodes 124 and/or source and drain regions 132 and 134 are parallel to each other. It will be understood that the transistors 116 and 118 may be otherwise parallel to each other within the scope of the present invention.

Parallel transistors 120 and 122 may each comprise a gate electrode 140 disposed over and insulated from an active area 142. The gate electrode 140 may include an enlarged contact area 144 and be insulated from the outer surface of the active area 142 by a gate insulator 146 (FIGS. 3). The gate electrode 140 may comprise polycrystalline silicon or other suitable semiconductor material. The gate insulator 146 may comprise silicon dioxide or other suitable insulating material.

The active areas 142 may each comprise a source region 148 separated from a drain region 150 by a channel region 152 (FIGS. 3). The gate electrode 140 may control the flow of current from the source region 148 to the drain region 150 through the channel region 152 to operate the transistor 120 or 122. It will be understood that the active area 142 may comprise other regions within the scope of the present invention.

Transistors 120 and 122 may be parallel to each other in that their gate electrodes 140 and/or source and drain regions 148 and 150 are parallel to each other. It will be understood that the transistors 120 and 122 may be otherwise parallel to each other within the scope of the present invention. Transistors 120 and 122 may be perpendicular to transistors 116 and 118 in that their gate electrodes 140 and/or source and drain regions 148 and 150 are perpendicular to gate electrodes 124 and/or source and drain regions 132 and 134. It will be understood that the transistors 120 and 122 may be otherwise perpendicular to transistors 116 and 118 within the scope of the present invention.

In a particular embodiment, the transistors 114 may comprise n-MOS transistors. In this embodiment, as previously described in connection with the active area 20, the active areas 126 and 142 may each comprise a p-well formed in the semiconductor layer 112. The p-well may comprise the single-crystalline silicon material of the semiconductor layer 112 slightly doped with a p-type dopant such as boron. It will be understood that the semiconductor layer 112 may comprise other materials or be otherwise doped within the scope of the present invention. Additionally, in a complimentary transistor embodiment having n-MOS and p-MOS transistors, the active areas 126 and/or 142 of the p-MOS transistors may comprise an n-well.

An isolation structure 156 may be formed on the semiconductor layer 112 and isolate the transistors 114. In one embodiment, the transistors 114 may be formed in windows of the isolation structure 156. In this embodiment, the isolation structure 156 may comprise a conventional field oxide. The windows for the transistors may be formed using conventional photolithography techniques associated with pattern and etching. It will be understood that other types of isolation structures may be used within the scope of the present invention. For example, the isolation structure 156 may comprise independent isolation trenches and the like.

Figure 2B:
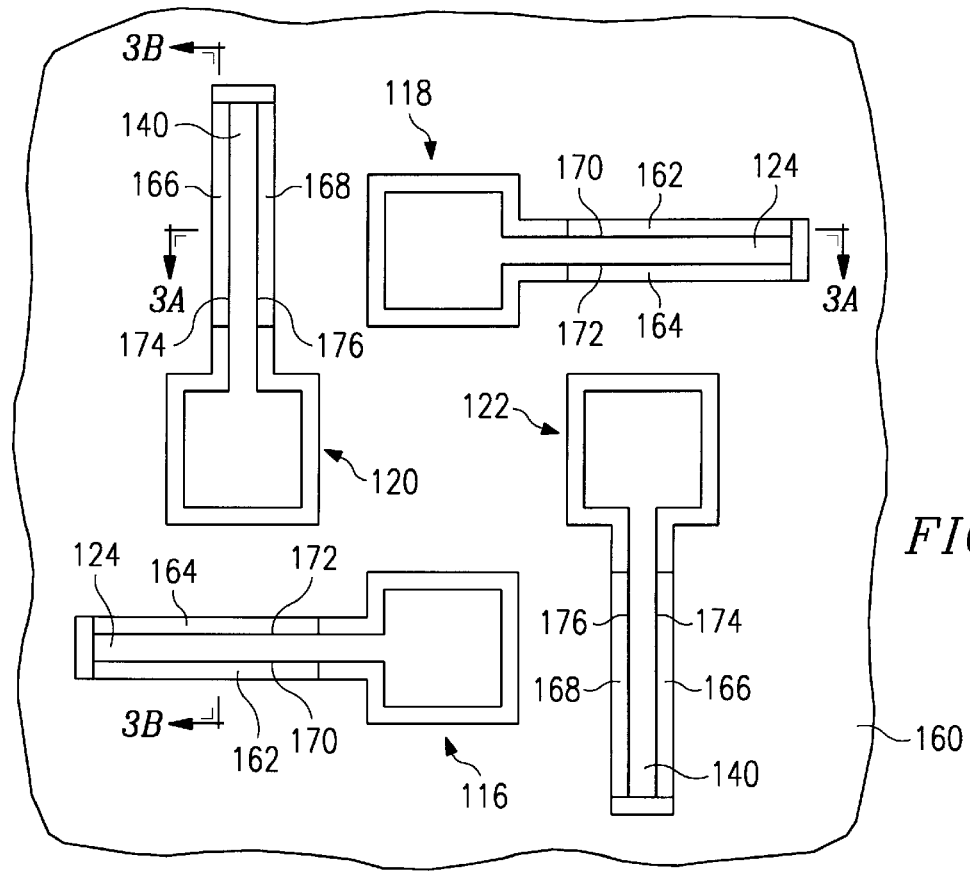

Referring to FIG. 2B, a masking layer 160 may be formed over the semiconductor layer 112 and expose limited sections of the active areas 126 and 142 of the transistors 114. In one embodiment, the exposed sections may include source sections 162 and drain section 164 of active areas 126 (FIG. 2A) and source sections 166 and drain sections 168 of active areas 142 (FIG. 2A). In this embodiment, each source section 162 may be proximate to a source side 170 of the gate electrode 124 and each drain section 164 may be proximate to a drain side 172 of the gate electrode 124. Each source section 166 may be proximate to a source side 174 of the gate electrode 140 and each drain section 168 may be proximate to a drain side 176 of the gate electrode 140. It will be understood that other sections of the active areas may be exposed by the masking layer 160 within the scope of the present invention.

The thickness of the masking layer 160 may vary within the scope of the present invention. As described in more detail below, the thickness of the masking layer 160 may be predefined based on the size of the exposed sections 162, 164, 166 and 168 and on a dopant implant angle into the exposed sections 162, 164, 166 and 168. It will be understood that the thickness of the masking layer 160 may be independently set or dependent on other parameters within the scope of the present invention.

In one embodiment, the masking layer 160 may comprise photoresist material. In this embodiment, as described in connection with the masking layer 30, the masking layer 160 may be conventionally patterned to expose sections 162, 164, 166 and 168. It will be understood that the masking layer 160 may comprise other materials within the scope of the present invention.

Figure 3A:
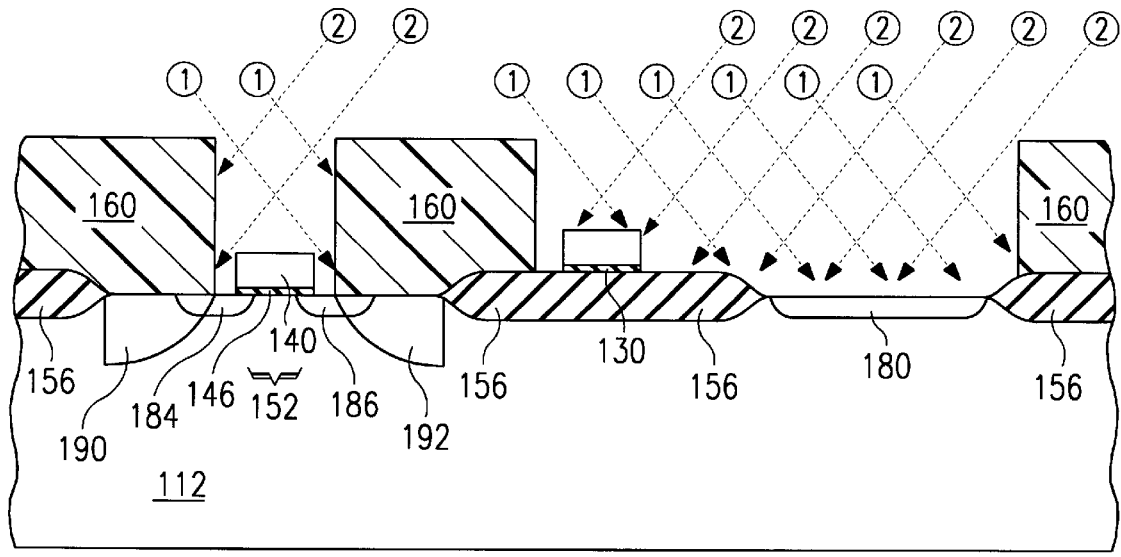
FIGS. 3A–B are a series of schematic cross-sectional diagrams illustrating four-rotational angled implant doping of the exposed sections of the transistor active areas to form the localized source and drain extensions and pockets in accordance with one embodiment of the present invention.
Figure 3B:
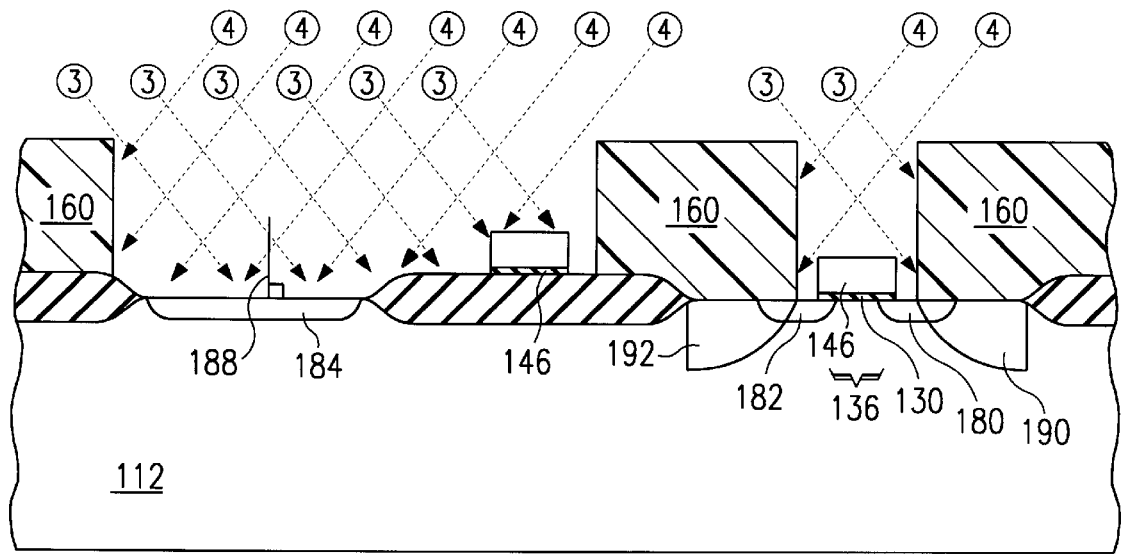

FIGS. 3A–B are a series of schematic cross-sectional diagrams illustrating four-rotational angled implant doping of the exposed sections 162, 164, 166 and 168 to form ultrashallow source and drain junctions and/or pockets with reduced gate overlap in accordance with one embodiment of the present invention. In this embodiment, the dopants may be implanted from four directions spaced 90 degrees apart. Preferably, the directions are each parallel and perpendicular to the gate electrodes 124 and 140. It will be understood that other implant schemes may be used within the scope of the present invention.

Referring to FIG. 3A, dopants may be implanted at an implant angle from a first direction "1" substantially parallel to the gate electrodes 124 and substantially perpendicular to the gate electrodes 140. The first direction dopants may enter into the source sections 162 to form ultrashallow source junctions 180 and into the drain sections 164 to form ultrashallow drain junctions 182 of the gate electrodes 124 parallel to the first direction. The masking layer 160 may block entry of dopants from the first direction into the source and drain sections 166 and 168 of the gate electrodes 140 perpendicular to the first direction. Accordingly, the dopants may be implanted from the first direction into the source and drain sections 162 and 164 without being implanted under the gate electrodes 140 perpendicular to the first direction.

Dopants may be implanted at the implant angle from a second direction "2" substantially opposite the first direction and parallel to the gate electrodes 124. The second direction dopants may enter into the source sections 162 to further form the ultrashallow source junctions 180 and into the drain sections 164 to further form the ultrashallow drain junctions 182 of the gate electrodes 124 parallel to the second direction. The masking layer 160 may block entry of the dopants from the second direction into the source and drain sections 166 and 168 of the gate electrodes 140 perpendicular to the second direction. Accordingly, the dopants may be further implanted from the second direction into the source and drain sections 162 and 164 without being implanted under the gate electrodes 140 perpendicular to the second direction.

Referring to FIG. 3B, dopants may be implanted at the implant angle from a third direction "3" substantially perpendicular to the first and second directions and parallel to the gate electrodes 140. The third direction dopants may be implanted into source sections 166 to form ultrashallow source junctions 184 and into drain sections 168 to form ultrashallow drain junctions 186 of gate electrodes 140 parallel to the third direction. The masking layer 160 may block entry of dopants from the third direction into the source and drain sections 162 and 164 of the gate electrodes 124 perpendicular to the third direction. Accordingly, the dopants may be implanted from the third direction into the source and drain sections 166 and 168 without being implanted under the gate electrodes 124 perpendicular to the third direction.

Dopants may be implanted at the implant angle from a fourth direction "4" substantially opposite the third direction and parallel to the gate electrodes 140. The fourth direction dopants may enter into the source sections 166 to further form the ultrashallow source junctions 184 and into the drain sections 168 to further form the ultrashallow drain junctions 186 of the gate electrodes 140 parallel to the fourth direction. The masking layer 160 may block entry of the dopants from the fourth direction into the source and drain sections 162 and 164 of the gate electrodes 124 perpendicular to the fourth direction. Accordingly, dopants may be implanted from the fourth direction into the source and drain sections 166 and 164 without being implanted under the gate electrodes 124 perpendicular to the fourth direction.

For the n-MOS transistor embodiment, the source and drain extensions may each comprise n-type dopants such as arsenic. The dopants may be implanted to moderate, heavy or other concentrations. In the moderately doped concentration embodiment, the dopants may be implanted to the concentration of about $1–2\ E19/CM^3$. In the heavily doped concentration embodiment, the dopants may be implanted to a concentration of about $1–2\ E20/CM^3$. It will be understood that the dopants may be otherwise implanted to other concentrations within the scope of the present invention.

The implant angle of dopants may vary within the scope of the present invention. Generally, the larger the implant angle from a perpendicular 188 of the semiconductor layer 12, the shallower the resulting source and drain junctions. In one embodiment, the dopants may be implanted at an angle of 7–30 degrees from the perpendicular 188. In this embodiment, the exposed sections 162, 164, 166 and 168 may each be sized between 0.1–0.3 microns and the masking layer 160 may have a thickness of 0.3–1.3 microns. It will be understood that the implant angle of the dopants may vary within in the scope of the present invention.

From the foregoing, dopants may be implanted from different directions at an angle to produce ultrashallow source and drain junctions. The masking layer blocks entry of dopants from nonparallel directions into the gate electrodes to prevent implantation under the gate electrodes and thus minimizes gate overlap. Accordingly, the transistors have a reduced gate overlap capacitance and may be more quickly charged for faster circuit speeds.

In one embodiment, the ultrashallow source junctions 180 and 184 may each comprise the localized source extension 52 and the ultrashallow drain junctions 182 and 186 may each comprise the localized drain extension 54. As previously described in connection with source and drain extensions 52 and 54, the source and drain pockets may be implanted inwardly of the extensions. The masking layer 160 may be the masking layer 30 and may be removed to allow formation of source and drain main bodies 190 and 192 in the semiconductor layer 112. It will be understood that the ultrashallow source and drain junctions 180, 182, 184 and 186 may comprise other source and drain structures within the scope of the present invention.

In this embodiment, the size of the exposed sections may be defined based on the desired size of the extensions and/or pockets, the implant angle may be defined based on the desired depth of the extensions and/or pockets and the masking layer deposited to a thickness that blocks entry of dopants from substantially perpendicular directions. In a particular embodiment, the exposed sections may be sized between 0.1–0.3 microns, the implant angle may be 7–30 degrees from the perpendicular 188 and a four rotational implant may be used with the masking layer having a thickness of 0.3–1.3 microns. The resulting transistors may have localized and ultrashallow source and drain extensions and pockets that greatly reduce capacitance of the transistor.

Although the present invention has been described with several embodiments, various changes and modifications may be suggested to one skilled in the art. It is intended that the present invention encompass such changes and modifications as fall within the scope of the appended claims.

What is claimed is:

1. A method of making a plurality of transistors in a semiconductor structure having a semiconductor layer, comprising the steps of:

forming a first gate electrode separated from a first active area of a semiconductor layer by a first gate insulator, said first gate electrode extending across said first active area in a first direction;

forming a second gate electrode separated from a second active area of the semiconductor layer by a second gate insulator, said second gate electrode extending across said second active area in a second direction, said second direction being substantially perpendicular to said first direction;

forming a masking layer over the semiconductor layer, the masking layer exposing:
  a source section of the first active area proximate to a source side of the first gate electrode;
  a drain section of the first active area proximate to a drain side of the first gate electrode;
  a source section of the second active area proximate to a source side of the second gate electrode;
  a drain section of the second active area proximate to a drain side of the second gate electrode;

implanting dopants substantially from said first direction into the source section of the first active area to form at least part of a first source region and into the drain section of the first active area to form at least part of a first drain region, the dopants implanted at an angle at which the masking layer blocks entry of the dopants from the first direction into the source and drain sections of the second active area; and implanting dopants substantially from said second direction into the source section of the second active area to form at least part of a second source region and into the drain section of the second active area to form at least part of a second drain region, the dopants implanted at the angle at which the masking layer blocks entry of dopants from the second direction into the source and drain sections of the first active area.

2. The method of claim 1, further comprising the step of removing at least a portion of the masking layer.

3. The method of claim 1, wherein the doped source section of the first active area is a first source extension, the doped drain section of the first active area is a first drain extension, the doped source section of the second active area is a second source extension, the doped drain section of the second active area is a second drain extension, further comprising the steps of:
  forming a first source main body associated with the first source extension;
  forming a first drain main body associated with the first drain extension;
  forming a second source main body associated with the second source extension; and
  forming a second drain main body associated with the second drain extension.

4. The method of claim 1, wherein the doped source section of the first active area is a first localized source extension, the doped drain section of the first active area is a first localized drain extension, the doped source section of the second active area is a second localized source extension, the doped drain section of the second active area is a second localized drain extension, further comprising the steps of:
  forming a first source main body associated with the first localized source extension;
  forming a first drain main body associated with the first localized drain extension;
  forming a second source main body associated with the second localized source extension; and
  forming a second drain main body associated with the second localized drain extension.

5. The method of claim 1, wherein the doped source section of the first active area is a first localized source extension, the doped drain section of the first active area is a first localized drain extension, the doped source section of the second active area is a second localized source extension, the doped drain section of the second active area is a second localized drain extension, further comprising the steps of:
  implanting pocket dopants from the first direction into the source section of the first active area to form a first localized source pocket bounding an inner perimeter of the first localized source extension;
  implanting pocket dopants from the first direction into the drain section of the first active area to form a first localized drain pocket bounding an inner perimeter of the first localized drain extension;
  implanting pocket dopants from the second direction into the source section of the second active area to form a second localized source pocket bounding an inner perimeter of the second localized source extension; and
  implanting pocket dopants from the second direction into the drain section of the second active area to form a second localized drain pocket bounding an inner perimeter of the second localized drain extension.

6. The method of claim 1, the step of forming a masking layer over the semiconductor layer further comprising the step of depositing a photoresist layer having a thickness greater than 0.3 microns.

7. The method of claim 1, the steps of implanting dopants further comprising the steps of implanting dopants to a moderately doped concentration.

8. The method of claim 1, the steps of implanting dopants further comprising the steps of implanting dopants to a heavily doped concentration.

9. The method of claim 1, further comprising the steps of:
  implanting dopants from a third direction substantially parallel to the first direction and to the first gate electrode into the source section of the first active area to form at least part of the first source region and into the drain section of the first active area to form at least part of the first drain region, the dopants implanted at an angle at which the masking layer blocks entry of the dopants from the third direction into the source and drain sections of the second active area; and
  implanting dopants from a fourth direction substantially parallel to the second direction and the second gate electrode into the source section of the second active area to form at least part of the second source region and into the drain section of the second active area to form at least part of the second drain region, the dopants implanted at an angle at which the masking layer blocks entry of the dopants from the fourth direction into the source and drain sections of the first active area.

10. A method of making an integrated circuit chip having a semiconductor layer, comprising the steps of:
  forming a first gate electrode separated from a first active area of a semiconductor layer by a first gate insulator, wherein said first gate electrode extends across said first active area in a first direction;
  forming a second gate electrode separated from a second active area of the semiconductor layer by a second gate insulator, wherein said second gate electrode extends across said second active area in a second direction perpendicular or approaching perpendicular to said first direction;

forming a masking layer over the semiconductor layer, the masking layer exposing:
- a source section of the first active area proximate to a source side of the first gate electrode;
- a drain section of the first active area proximate to a drain side of the first gate electrode;
- a source section of the second active area proximate to a source side of the second gate electrode;
- a drain section of the second active area proximate to a drain side of the second gate electrode;

implanting dopants substantially from said first direction into the source section of the first active area to form at least part of a first source region and into the drain section of the first active area to form at least part of a first drain region, the dopants implanted at an angle at which the masking layer blocks entry of the dopants from the first direction into the source and drain sections of the second active area; and implanting dopants substantially from said second direction into the source section of the second active area to form at least part of a second source region and into the drain section of the second active area to form at least part of a second drain region, the dopants implanted at the angle at which the masking layer blocks entry of dopants from the second direction into the source and drain sections of the first active area.

11. The method of claim 10, further comprising the step of removing at least a portion of the masking layer.

12. The method of claim 10, wherein the doped source section of the first active area is a first source extension, the doped drain section of the first active area is a first drain extension, the doped source section of the second active area is a second source extension, the doped drain section of the second active area is a second drain extension, further comprising the steps of:
- forming a first source main body associated with the first source extension;
- forming a first drain main body associated with the first drain extension;
- forming a second source main body associated with the second source extension; and
- forming a second drain main body associated with the second drain extension.

13. The method of claim 10, wherein the doped source section of the first active area is a first localized source extension, the doped drain section of the first active area is a first localized drain extension, the doped source section of the second active area is a second localized source extension, the doped drain section of the second active area is a second localized drain extension, further comprising the steps of:
- forming a first source main body associated with the first localized source extension;
- forming a first drain main body associated with the first localized drain extension;
- forming a second source main body associated with the second localized source extension; and
- forming a second drain main body associated with the second localized drain extension.

14. The method of claim 10, wherein the doped source section of the first active area is a first localized source extension, the doped drain section of the first active area is a first localized drain extension, the doped source section of the second active area is a second localized source extension, the doped drain section of the second active area is a second localized drain extension, further comprising the steps of:

implanting pocket dopants from the first direction into the source section of the first active area to form a first localized source pocket bounding an inner perimeter of the first localized source extension;

implanting pocket dopants from the first direction into the drain section of the first active area to form a first localized drain pocket bounding an inner perimeter of the first localized drain extension;

implanting pocket dopants from the second direction into the source section of the second active area to form a second localized source pocket bounding an inner perimeter of the second localized source extension; and implanting pocket dopants from the second direction into the drain section of the second active area to form a second localized drain pocket bounding an inner perimeter of the second localized drain extension.

15. The method of claim 10, the step of forming a masking layer over the semiconductor layer further comprising the step of depositing a photoresist layer having a thickness greater than 0.3 microns.

16. The method of claim 10, the steps of implanting dopants further comprising the steps of implanting dopants to a moderately doped concentration.

17. The method of claim 10, the steps of implanting dopants further comprising the steps of implanting dopants to a heavily doped concentration.

18. A method of making a plurality of transistors in a semiconductor structure having a semiconductor layer, comprising the steps of:
- forming a first source side isolation structure and a first drain side isolation structure defining a first active area in the semiconductor layer;
- forming a first gate electrode separated from the first active area by a first gate insulator, said first gate electrode extending across said first active area in a first direction;
- forming a second source side isolation structure and a second drain side isolation structure defining a second active area in a semiconductor layer;
- forming a second gate electrode separated from a second active area of the semiconductor layer by a second gate insulator, said second gate electrode extending across said second active area in a second direction, said first and second directions being substantially 90° apart;
- forming a masking layer over the semiconductor layer, the masking layer exposing:
  - a source section of the first active area proximate to a source side of the first gate electrode facing the first source side isolation structure and spaced apart from the first source side isolation structure;
  - a drain section of the first active area proximate to a drain side of the first gate electrode facing the first drain side isolation structure and spaced apart from the first drain side isolation structure;
  - a source section of the second active area proximate to a source side of the second gate electrode facing the second source side isolation structure and spaced apart from the second source side isolation structure;
  - a drain section of the second active area proximate to a drain side of the second gate electrode facing the second drain side isolation structure and spaced apart from the second drain side isolation structure;
- implanting dopants substantially from said first direction into the source section of the first active area to form a first localized source extension and into the drain section of the first active area to form a first localized drain extension, the dopants implanted at an angle at which the masking layer blocks entry of the dopants from the first direction into the source and drain sections of the second active area; and implanting dopants substantially from said second direction into the source section of the second active area to form a second localized source extension and into the drain section of the second active area to form a second localized drain extension, the dopants implanted at the angle at which the masking layer blocks entry of dopants from the second direction into the source and drain sections of the first active area.

19. The method of claim 18, further comprising the steps of:

implanting pocket dopants from the first direction into the source section of the first active area to form a first localized source pocket bounding an inner perimeter of the first localized source extension;

implanting pocket dopants from the first direction into the drain section of the first active area to form a first localized drain pocket bounding an inner perimeter of the first localized drain extension;

implanting pocket dopants from the second direction into the source section of the second active area to form a second localized source pocket bounding an inner perimeter of the second localized source extension; and implanting pocket dopants from the second direction into the drain section of the second active area to form a second localized drain pocket bounding an inner perimeter of the second localized drain extension.

20. The method of claim 18, the step of forming a masking layer over the semiconductor layer further comprising the step of depositing a photoresist layer having a thickness greater than 0.3 microns.

21. The method of claim 18, wherein:

the first localized source extension extending less than half a distance between the source side of the first gate electrode and the first source side isolation structure;

the first localized drain extension extending less than half a distance between the drain side of the first gate electrode and the first drain side isolation structure;

the second localized source extension extending less than half a distance between the source side of the second gate electrode and the second source side isolation structure; and the first localized drain extension extending less than half a distance between the drain side of the second gate electrode and the second drain side isolation structure.

* * * * *